(12) United States Patent
Hoefler et al.

(10) Patent No.: US 6,939,767 B2
(45) Date of Patent: Sep. 6, 2005

(54) MULTI-BIT NON-VOLATILE INTEGRATED CIRCUIT MEMORY AND METHOD THEREFOR

(75) Inventors: Alexander B. Hoefler, Austin, TX (US); Ko-Min Chang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/716,956

(22) Filed: Nov. 19, 2003

(65) Prior Publication Data

US 2005/0106812 A1    May 19, 2005

(51) Int. Cl.$^7$ ............................................. H01L 21/336
(52) U.S. Cl. ...................... 438/267; 257/315; 257/316; 438/257
(58) Field of Search ................................ 438/257, 266, 438/267

(56) References Cited

U.S. PATENT DOCUMENTS

| | | | | |
|---|---|---|---|---|
| 5,023,680 A | * | 6/1991 | Gill et al. .................... | 257/317 |
| 5,969,383 A | | 10/1999 | Chang | |
| 6,091,102 A | * | 7/2000 | Sekariapuram et al. ..... | 257/316 |
| 6,201,282 B1 | | 3/2001 | Eitan | |
| 6,630,384 B1 | * | 10/2003 | Sun et al. .................... | 438/266 |
| 6,635,533 B1 | * | 10/2003 | Chang et al. ................ | 438/259 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.
Chang et al., "New SONOS Memory Using Source-Side Injection for Programming," IEEE Electron Device Letters, vol. 19, No. 7, Jul. 1998, pp. 253-255.

* cited by examiner

Primary Examiner—Thao P. Le
(74) Attorney, Agent, or Firm—Daniel D. Hill; Michael Balconi-Lamica

(57) ABSTRACT

A non-volatile memory (10) includes at least two buried bit lines (45, 47) formed within a semiconductor substrate (12), a charge storage layer (18) overlying the semiconductor substrate (12); a control gate (26) overlying the charge storage layer (18); an insulating liner (30) overlying the control gate; and first and second conductive sidewall spacer control gates (32, 34). Multiple programmable charge storage regions (42) and (41, 44) are created within the charge storage layer (18) beneath respective ones of the control gate (26) and the first and second sidewall spacer control gates (32, 34). Also, the non-volatile memory (10) is a virtual ground NOR type multi-bit flash EEPROM (electrically erasable programmable read only memory). By using conductive sidewall spacers as the control gates, a very dense multi-bit non-volatile memory can be manufactured.

21 Claims, 5 Drawing Sheets

MULTI-BIT NON-VOLATILE INTEGRATED CIRCUIT MEMORY AND METHOD THEREFOR

FIELD OF THE INVENTION

This invention relates generally to integrated circuits, and more particularly to a multi-bit non-volatile memory and method therefor.

BACKGROUND OF THE INVENTION

Some multi-bit non-volatile memory cells store more than one bit per cell by including more than one separate charge storage regions. In a prior art multi-bit, contactless, non-volatile memory array, the minimum area required by a memory cell is determined, at least in part, by the minimum pitch of the word lines. In some non-volatile memory arrays, more than fifty percent of the surface area of a memory cell is not used for storing information, that is, the extra surface area may be referred to as "dead space".

Therefore, what is needed is a multi-bit, contactless, non-volatile memory array that can store more bits in a given area.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings, in which like or similar element have the same reference number.

DETAILED DESCRIPTION OF A PREFERRED EMBODIMENT

Generally, the present invention provides a high density virtual ground NOR type multi-bit flash EEPROM (electrically erasable programmable read only memory) non-volatile memory. The non-volatile memory includes at least two buried bit lines formed within the semiconductor substrate, a charge storage layer overlying the semiconductor substrate; a first control gate overlying the charge storage layer; an insulating liner overlying the first control gate; and first and second sidewall spacer control gates. Multiple programmable charge storage regions are created within the charge storage layer beneath respective ones of the control gates.

By using conductive sidewall spacers as the control gates, a very dense multi-bit non-volatile memory can be manufactured. For example, in one embodiment, six bits of information can be stored in the amount of space required to store just two bits in a prior art non-volatile memory.

Figure 1:
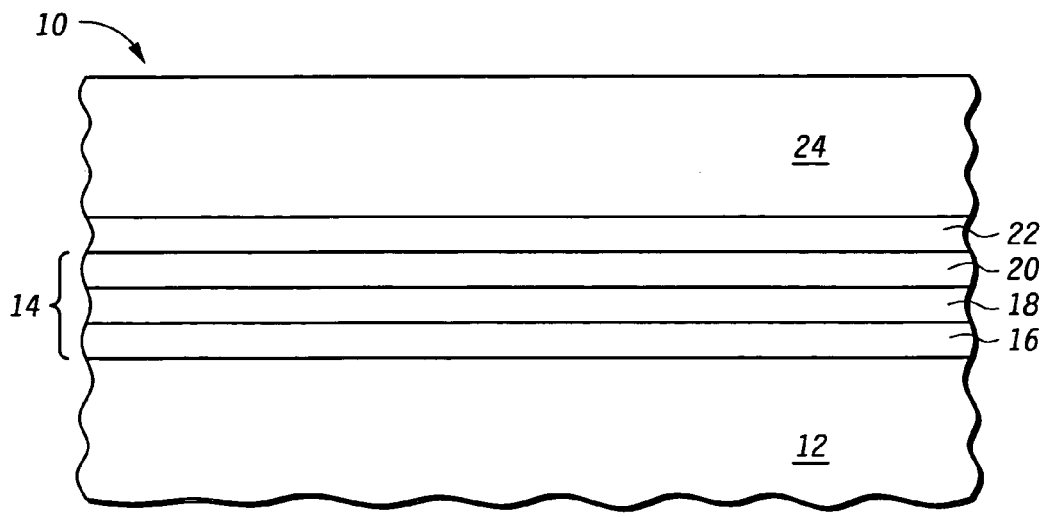
FIGS. 1–4 illustrate, in a cross-sectional view, a method for forming a non-volatile memory cell in accordance with one embodiment of the present invention.

FIGS. 1–4 illustrate, in a cross-sectional view, a method for forming a non-volatile memory cell in accordance with one embodiment of the present invention. FIG. 1 illustrates a semiconductor device 10 having a substrate 12 and a charge storage stack 14 formed thereon. Substrate 12 is formed from a semiconductive material having a P+ conductivity type. Charge storage stack 14 includes insulating layers 16 and 20 and a nitride layer 18. Insulating layer 16 is formed in substrate 12 having a thickness of between about 15 to 60 angstroms. Charge storage layer 18 is deposited on the surface of insulating layer 16 having a thickness of between about 50 to 150 angstroms. Insulating layer 20 is formed on charge storage layer 18 having a thickness of between about 40 to 100 angstroms. In the illustrated embodiment, insulating layer 16 is formed from an oxide grown on the surface of substrate 12, charge storage layer 18 is deposited nitride, and insulating layer 20 is an oxide deposited on charge storage layer 18. In another embodiment, charge storage layer 18 may be an $Si_3N_4$ layer, an oxynitride layer, a layer consisting of a plurality of nanocrystals, a layer consisting of a plurality of nanoclusters, and any combinations thereof. In general, charge storage layer 18 consists of a material that is not electrically conductive, and thus provides for a localized storage of injected charge. Also, charge storage stack 14 may be an ONO stack, an oxide-nanocrystal-oxide stack, and an oxide-nanocluster-oxide stack. Optionally, another insulating layer 22 may be formed on top of insulating layer 20 having a thickness of about 50 angstroms. Insulating layer 22 is preferably formed from nitride and prevents a subsequent gate etch process step from inadvertently removing insulating layer 20. A conductive layer 24 is deposited on insulating 22. In the illustrated embodiment, conductive layer 24 is formed from highly doped polysilicon having a thickness of about 2000 angstroms or less. The polysilicon doping concentration is usually between $10^{19}$ and $10^{21}$ dopant atoms per cubic centimeter. In other embodiments, conductive layer 24 may include a metal.

Figure 2:
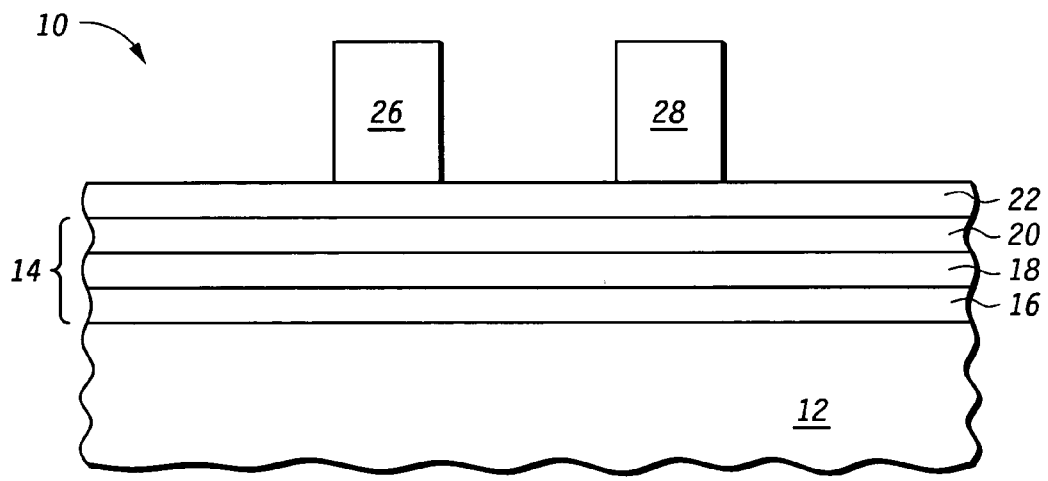

FIG. 2 illustrates a step of patterning conductive layer 24 to form a plurality of control gates represented by control gates 26 and 28. A masking step is used to form control gates 26 and 28. Control gates 26 and 28 have a width of about 0.13 microns in the illustrated embodiment, which is a minimum dimension for the intended manufacturing process. In addition, the control gates are about 0.13 microns apart. In other embodiments, the minimum dimension may be different. Note that control gates also form word lines for accessing the memory cells of the array.

Figure 3:
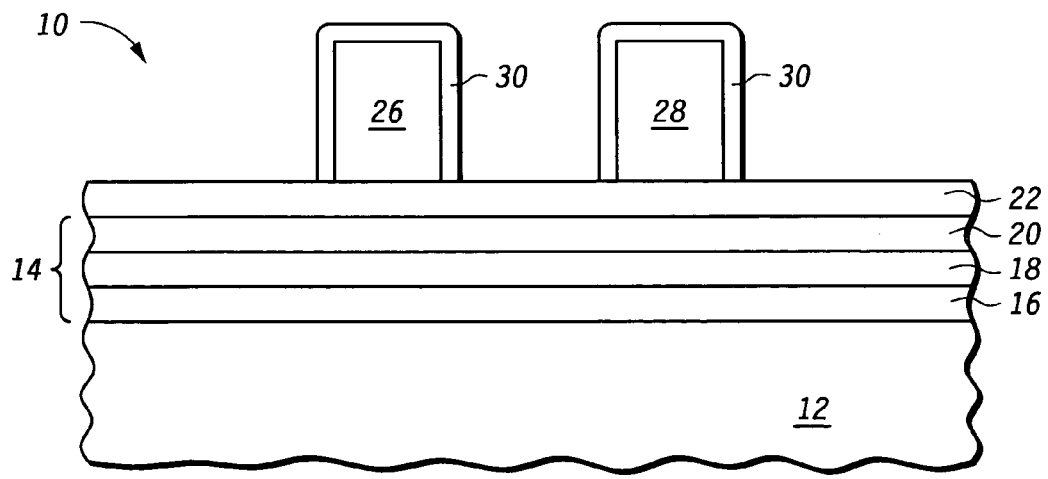

FIG. 3 illustrates a step of forming an insulating layer 30 around control gates 26 and 28. Insulating layer 30 is formed by thermal oxidation of the sides and top of polysilicon control gates 26 and 28, and forms an insulating liner to isolate the control gates 26 and 28 from sidewall spacers formed later in FIG. 4. In the illustrated embodiment, insulating layer 30 is about 200 angstroms thick. Alternately, insulating layer 30 may be deposited oxide or another deposited insulating material.

Figure 4:
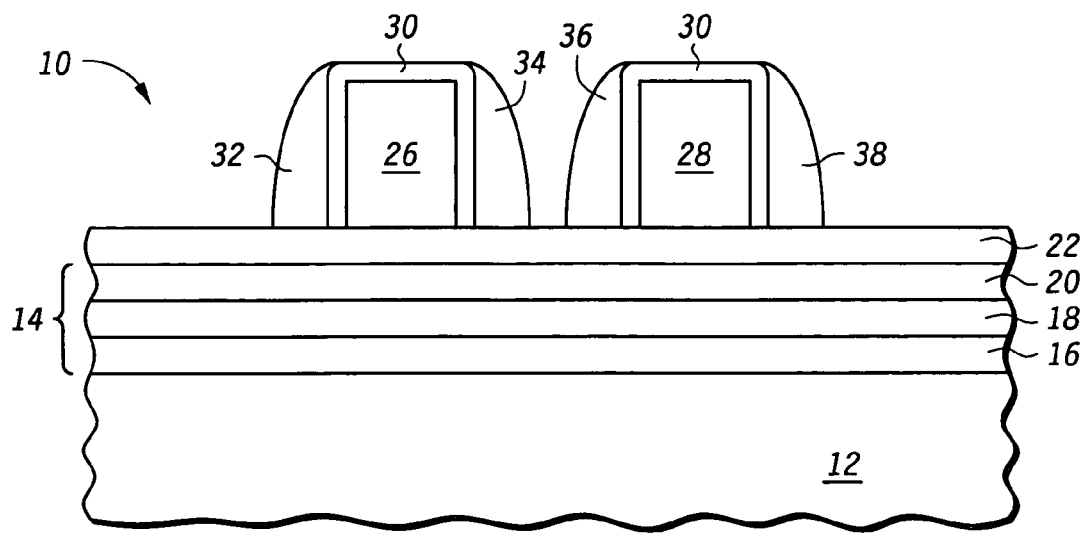

FIG. 4 illustrates a step of forming conductive sidewall spacers 32, 34, 36, and 38 on the sides of control gates 26 and 28 for semiconductor device 10. Conductive sidewall spacers 32, 34, 36, and 38 are formed from highly doped polysilicon. Sidewall spacers 32, 34, 36, and 38 are formed from deposited polysilicon using a conventional sidewall spacer manufacturing process. The deposited polysilicon is doped with a concentration of dopant atoms that is similar to the doping concentration in the conducting layer 24. The sidewall spacers form word lines for applying address signals to access memory cells, and function as control gates. In another embodiment, the sidewall spacers may be formed from a metal.

Figure 5:
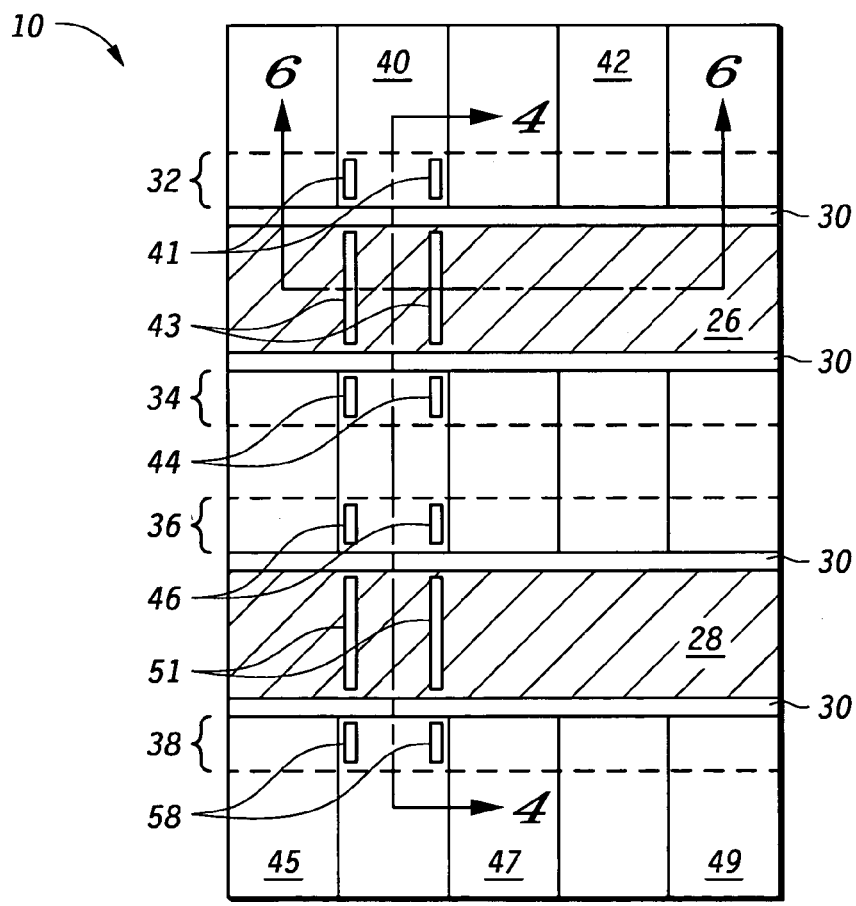
FIG. 5 illustrates, in a top-down view, a layout of a semiconductor device including the non-volatile memory cell of FIG. 4.

FIG. 5 illustrates, in a top-down view, a layout of semiconductor device 10. The cross-sectional view of FIG. 4 is along line 4—4 in FIG. 5. Semiconductor device 10 is a portion of a non-volatile memory. As illustrated in FIG. 5, patterned polysilicon lines 26 and 28, and sidewall spacers 32, 34, 36, and 38 form both control gates and word lines for a non-volatile memory in accordance with one embodiment of the present invention. Sidewall spacers 32, 34, 36, and 38 also form word lines. The sidewall spacers being isolated from control gates 26 and 28 by protective liner 30. Active region 40 is formed between bit lines 45 and 47. Active region 42 is formed between bit lines 47 and 49. In the illustrated embodiment, bit lines 45, 47, and 49 are buried bit lines diffused into substrate 12. When a non-volatile memory cell is programmed, using, for example a technique known as hot carrier injection, charge accumulates in areas of nitride layer 18 at junctions of the word lines and bit lines. For programming to occur, a bitcell must be electrically selected for programming. Most of the charge accumulates at the edges of the active regions. In the illustrated embodiment, charge is stored under both edges of active regions under each of the word lines. For example, two charge storage regions 41 are located under word line 32, two charge storage regions 43 are located under word line 26, two charge storage regions 44 are located under word line 34, two charge storage regions 46 are located under word line 36, two charge storage regions 51 are located under word line 28, and two charge storage regions 58 are located under word line 38. There are similar charge storage regions in active region 42 that are not shown. Each charge storage region can store one bit of information. Therefore, in the illustrated embodiment, up to six (6) charge storage regions are available in a unit cell (i.e. at the intersection of a single word line and active region). Thus, the memory of the present invention requires the same or less surface area to store a single bit than some prior art two-bit per cell non-volatile memories. Consequently, the area per bit required for the bitcell of the present invention is much smaller than the area per bit required in a prior art two-bit per cell non-volatile memory.

Figure 6:
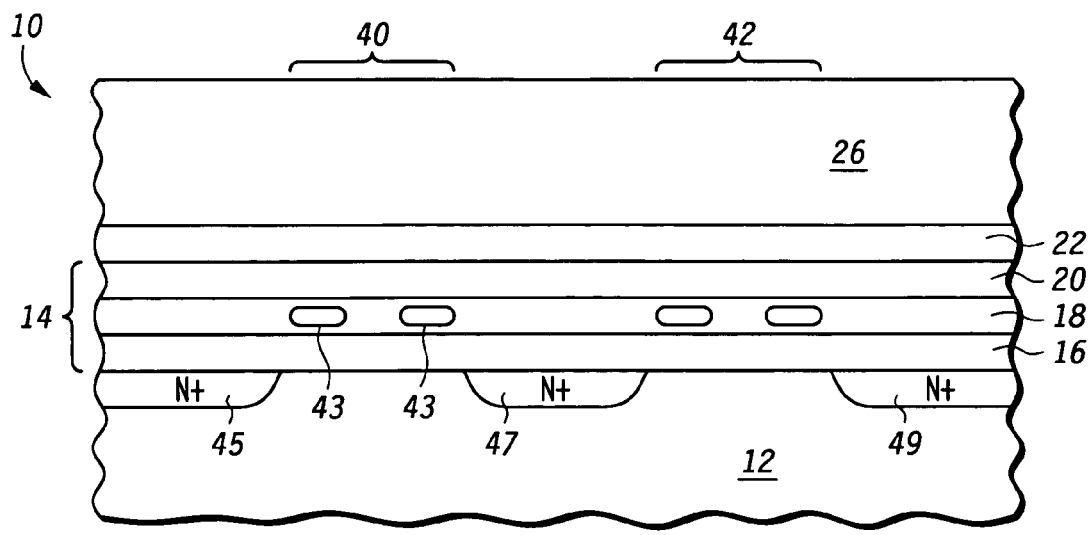
FIG. 6 illustrates a cross-section of the non-volatile memory cell of FIG. 5 along a line 6—6.

FIG. 6 illustrates a cross-sectional view of the semiconductor device 10 of FIG. 5 along a line 6—6. In FIG. 6, bit lines 45, 47, and 49 are formed by diffusing dopants that create N-type conductivity into the substrate 12 which is doped to have P-type conductivity. Note that in other embodiments the conductivity types may be reversed. A typical dopant concentration in the P-type substrate is between $10^{17}$ and $10^{18}$ atoms per cubic centimeter. A typical dopant concentration in the N+-type bitlines is between $10^{19}$ and $10^{21}$ atoms per cubic centimeter. Charge storage stack 14 is illustrated with charge storage layer 18 between insulating layers 16 and 20. The optional insulating layer 22 is formed over insulating layer 20 as described above. During programming of the memory cells, charge is collected in charge storage regions of charge storage layer 18 such as one of the two charge storage regions 43. As can be seen in FIG. 6, the charge is collected at the edges of the active regions 40 and 42 below the control gates and above the bit lines.

Figure 7:
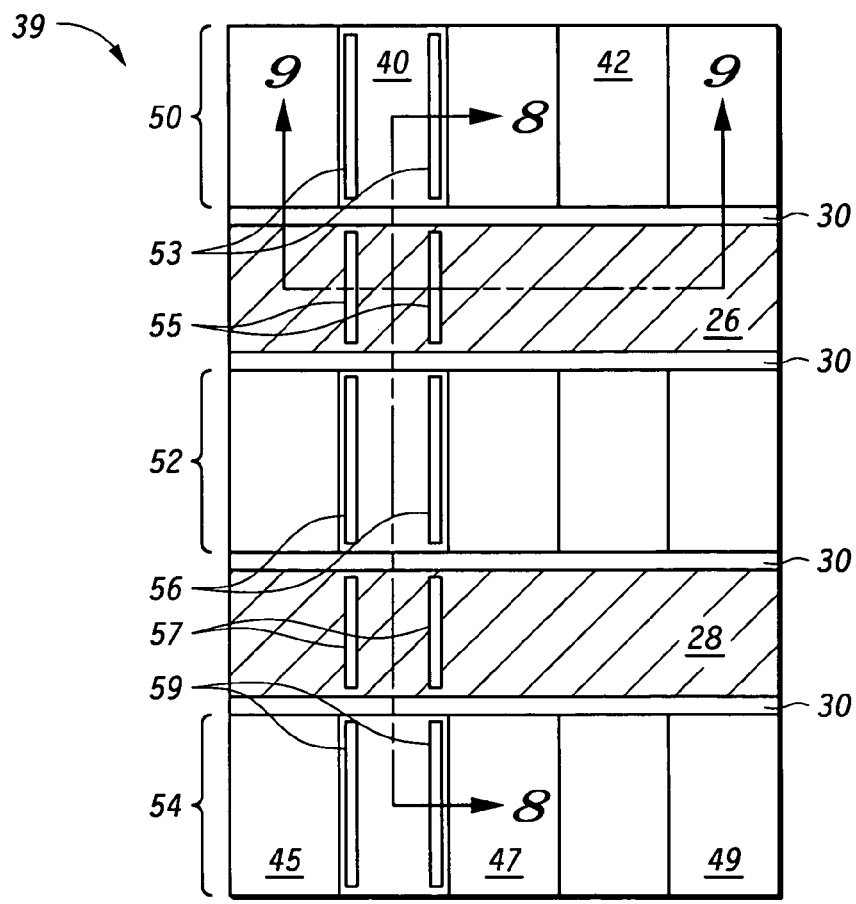
FIG. 7 illustrates, in a top-down view, a layout of a semiconductor device including a non-volatile memory cell in accordance with another embodiment of the present invention.

FIG. 7 illustrates, in a top-down view, a layout of a semiconductor device 39 in accordance with another embodiment of the present invention. Semiconductor device 39 differs from semiconductor device 10 of FIG. 5 in that instead of using conventional polysilicon sidewall spacers for the additional word lines, the word lines are formed by depositing polysilicon in the spaces between insulating layers 30. The result is fewer charge storage regions and word lines having larger cross-sectional areas as is illustrated in the cross-sectional view of FIG. 8. For example, semiconductor device 39 includes additional word lines 50, 52, and 54 formed in this manner. Additional word lines 50, 52, and 54 are separated from word lines 26 and 28 by oxide layers 30. Charge is stored at the edges, or periphery, of active regions 40 and 42 under each of the word lines. For example, two charge storage regions 53 are located under word line 50, two charge storage regions 55 are located under word line 26, two charge storage regions 56 are located under word line 52, two charge storage regions 57 are located under word line 28 and two charge storage regions 59 are located under word line 54. Like the embodiment of FIG. 5, the semiconductor device 39 of FIG. 7 provides a more dense memory than the prior art.

Figure 8:
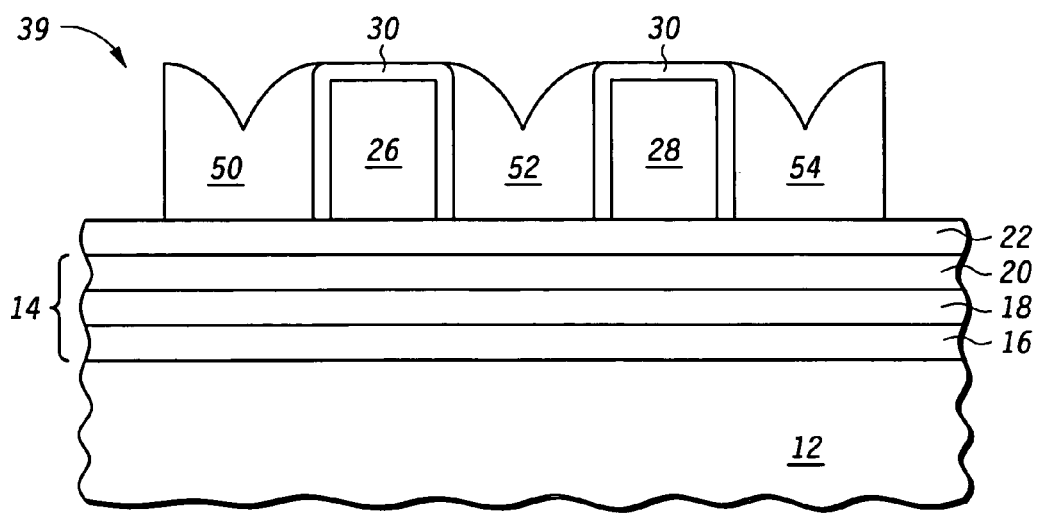
FIG. 8 illustrates a cross-section of the semiconductor device of FIG. 7 along a line 8—8.

FIG. 8 illustrates a cross-section of semiconductor device 39 of FIG. 7 along a line 8—8. To make semiconductor device 39, the first steps are the same as described above regarding FIG. 1, FIG. 2 and FIG. 3. Then, instead of forming sidewall spacers on the sides of word lines 26 and 28, the spaces between the word lines are filled with polysilicon to form control gates/word lines 50, 52, and 54. Control gates 50, 52, and 54 are formed by depositing a conformal layer of conductive material overlying control gates 26 and 28 followed by anisotropic etching of the conformal layer, or by a combination of multiple deposition and etch processes of various types. In another embodiment, word lines 50, 52, and 54 may be formed by merging the sidewall spacers illustrated in FIG. 4 until they contact each other, or grow together.

Figure 9:
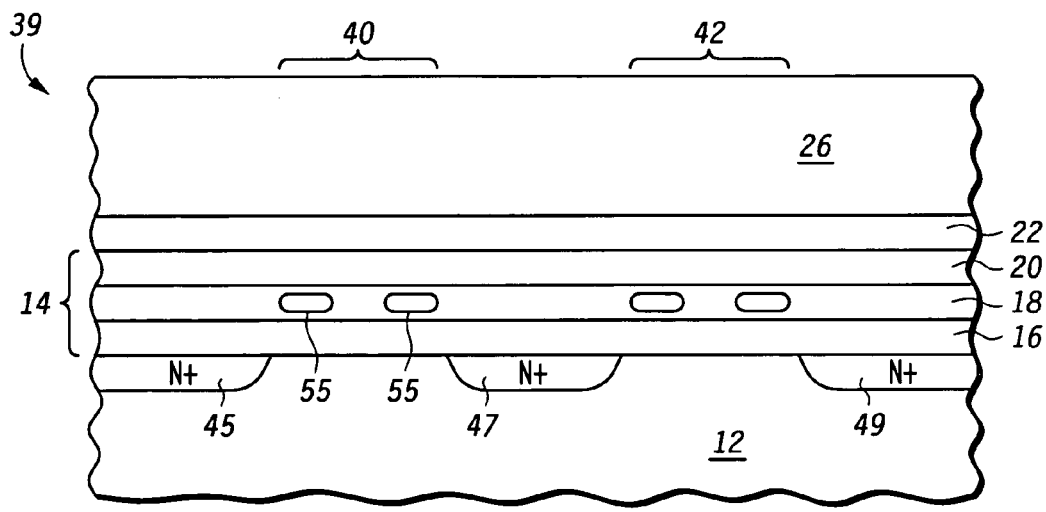
FIG. 9 illustrates a cross-section of the of the semiconductor device of FIG. 7 along a line 9—9.

FIG. 9 illustrates a cross-section of the of semiconductor device 39 of FIG. 7 along a line 9—9. The cross-sectional view of semiconductor device 39 along word line 26 is similar to the cross-sectional view of semiconductor device 10 illustrated in FIG. 6. In FIG. 9, bit lines 45, 47, and 49 are formed by diffusing dopants that create N-type conductivity in the P doped substrate 12. In other embodiments the conductivity types may be different or reversed. A typical dopant concentration in the P-type substrate is between $10^{17}$ and $10^{18}$ atoms per cubic centimeter. A typical dopant concentration in the N+-type bit lines is between $10^{19}$ and $10^{21}$ atoms per cubic centimeter. Charge storage stack 14 is illustrated with charge storage layer 18 between insulating layers 16 and 20. The optional insulating layer 22 is formed over insulating layer 20 as described above. During programming of the memory cells, charge is collected in selected charge storage regions of charge storage layer 18 such as charge storage regions 55. As illustrated in FIG. 9, charge is collected at the edges of the active regions 40 and 42 below the control gates, such as for example, charge storage regions 55 under word line 26.

Figure 10:
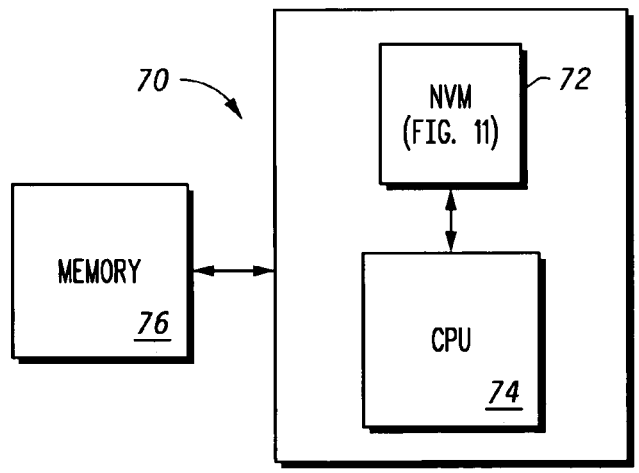
FIG. 10 illustrates, in block diagram form, an integrated circuit including a non-volatile memory in accordance with the present invention.
Figure 11:
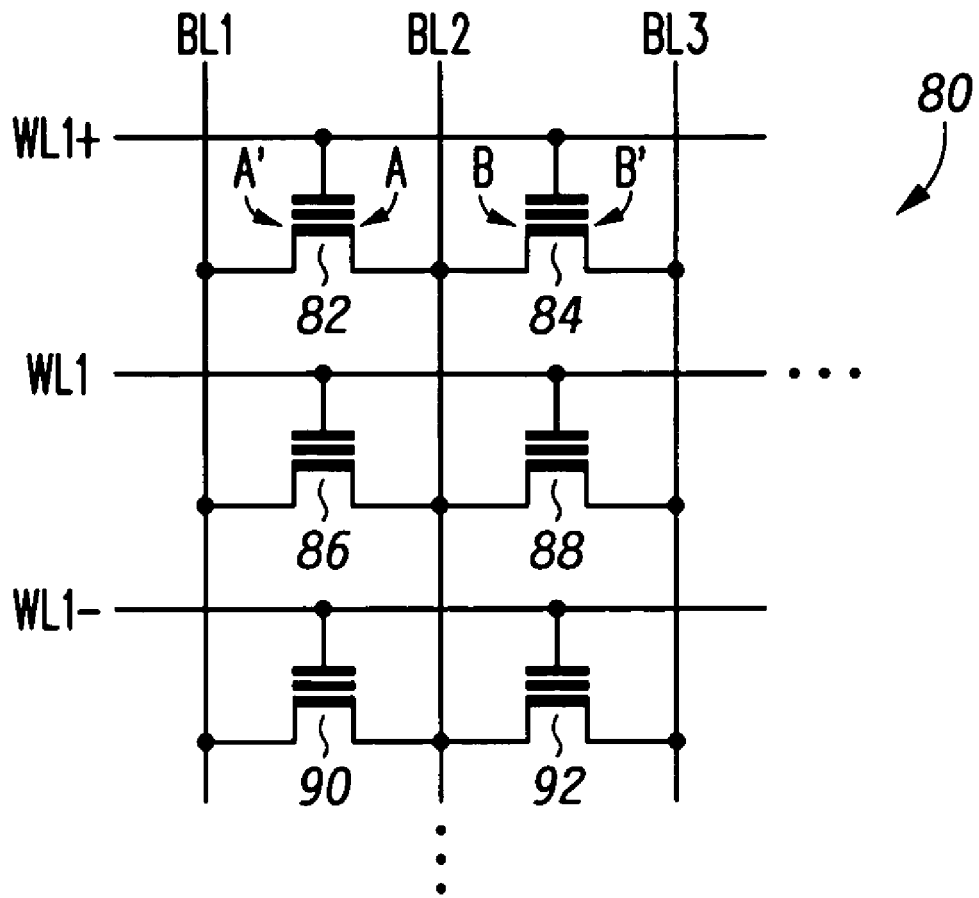
FIG. 11 illustrates, in schematic diagram form, a non-volatile memory in accordance with the present invention.

FIG. 10 illustrates, in block diagram form, an integrated circuit 70. Integrated circuit 70 includes a central processing unit 74 bi-directionally coupled to a non-volatile memory array 72. A detailed schematic diagram of non-volatile memory array 72 is illustrated in FIG. 11. In other embodiments, integrated circuit 70 may include additional circuitry (not shown), such as for example, co-processors, input/output (I/O) ports, additional memory, etc. Non-volatile memory 72 includes a plurality of non-volatile memory cells in accordance with the present invention. Optionally, an integrated circuit memory 76, separate from integrated circuit 70, may be bi-directionally coupled to integrated circuit 70 and include a plurality of memory cells in accordance with the present invention. Integrated circuit memory 76 may comprise memory cells as described above for either embodiment of the present invention. Implementing memory cells of the present invention in integrated circuit 70 provides the advantage of requiring less surface area of integrated circuit 70 than prior art multi-bit non-volatile memory cells. If the memory array requires less surface area, then the integrated circuit can be made smaller and less expensive to manufacture.

FIG. 11 illustrates, in schematic diagram form, non-volatile memory array portion 80 in accordance with the present invention. Non-volatile memory array portion 80 corresponds to memory layout 39 of FIG. 7. Memory array portion 80 includes non-volatile memory cells 82, 84, 86, 88, 90, and 92. Each memory cell in FIG. 11 schematically represents an intersection of a word line and two bit lines for storing two bits of information as illustrated in, for example, FIG. 7. Two charge storage regions are located at each intersection at the edges of the active region underlying the control gate. In FIG. 11, two charge storage regions of memory cell 82 are labeled A and A', and two charge storage regions of memory cell 84 are labeled B and B'. A control gate of each of cells 86 and 88 is coupled to a word line labeled WL1. Word line WL1 corresponds to, for example, word line 26 of FIG. 7. A control gate of cells 82 and 84 are coupled to a word line labeled WL1+, corresponding to one of word lines 50 or 52 of FIG. 7. A control gate of cells 90 and 92 are coupled to a word line labeled WL−, corresponding to the other one of word lines 50 or 52 of FIG. 7. Each of the memory cells is coupled to two bit lines. For example, cells 82, 86, and 90 are coupled to bit lines BL1 and BL2, and cells 84, 88, and 92 are coupled to bit lines BL2 and BL3. Bit line BL1 corresponds to, for example, bit line 45, bit line BL2 corresponds to bit line 47, and bit line BL3 corresponds to bit line 49.

Each of the charge storage regions can be programmed, read, and erased separately. Hot carrier injection is the mechanism used to program each charge storage region and Fowler-Nordheim tunneling is the mechanism used to erase each charge storage region. In other embodiments, other methods, such as for example, Fowler-Nordheim tunneling, may be used for programming. Because the memory array of the present invention is very dense as compared to the prior art, the bit lines are relatively more closely spaced. Because of the close spacing, capacitive coupling between the bit lines can cause inadvertent programming of cells that are adjacent to a cell being programmed. To prevent the effects of capacitive coupling, or cross-coupling, the adjacent bit lines are held at an intermediate voltage level.

To program, for example, charge storage region A of cell 82 with a logic "one", word line WL1+ is provided with about 6 volts and bit line BL2 is at 3 volts. Also, adjacent word line WL1 is at zero volts, bit line BL1 is held at zero volts, and bit line BL3 is at an intermediate voltage of, for example, 1.5 volts to prevent the possibility of unintentionally programming charge storage region B in cell 84. To program charge storage region B of cell 84 with a logic "one", word line WL1+ is provided with about 6 volts and bit line BL2 is at 3 volts. Also, adjacent word line WL1 is at zero volts, bit line BL1 is at the intermediate voltage of 1.5 volts, and BL3 is at zero volts. During programming, the substrate bias is held at less than or equal to zero volts.

To read charge storage region A of cell 82, word line WL1+ is provided with 3 volts and bit line BL1 is provided with 1.5 volts. The logic state of region A of cell 82 is sensed on bit line BL1. Also, while reading region A of cell 82, word line WL1 and bit line BL3 are both held at zero volts and the substrate is biased at a voltage of less than or equal to zero volts. To read charge storage region B of cell 84, word line WL1+ is provided with 3 volts and bit line BL3 is provided with 1.5 volts. The logic state of region B of cell 84 is sensed on bit line BL3. Also, while reading region B of cell 84, word line WL1, bit line BL1 are both held at zero volts and the substrate is biased at zero volts.

The array is bulk erased by floating all of the bit lines and applying −6 volts to the word lines while the substrate is biased at +6 volts. Alternatively, the bit lines can be biased at a voltage that is identical to the substrate during the erase process. Yet another method is to only bias one or few selected word lines to, for example, −6 volts and leave all other word lines at a bias of zero volts, and bias the substrate at +6 volts. In this case, only the cells connected to the biased word line or word lines will be erased. In yet another erase method, the substrate is kept at zero volts, the bit lines are biased to +6 volts, and the word lines are biased to −6 volts. Yet another method is to only bias one or a few selected word lines to, for example, −6 volts, and bias all bit lines to +6 volts. In this case, only the cells connected to the biased word line or word lines will be erased.

Various changes and modifications to the embodiments herein chosen for purposes of illustration will readily occur to those skilled in the art. For example, variations in the types of conductivities of transistors, the types of transistors, etc. may be readily made. Although specific structures have been shown, numerous structure implementations may be used to implement the functions discussed herein. To the extent that such modifications and variations do not depart from the spirit of the invention, they are intended to be included within the scope thereof which is assessed only by a fair interpretation of the following claims.

What is claimed is:

1. A method of making a non-volatile memory comprising:
   providing a semiconductor substrate;
   forming at least two buried bit lines within the semiconductor substrate, wherein forming the at least two buried bit lines defines boundaries that delineate the at least two buried bit lines from an active region disposed between the buried bit lines;
   providing a charge storage layer overlying the semiconductor substrate;
   forming a first control gate overlying the charge storage layer; forming an insulating liner overlying the first control gate; and
   forming first and second sidewall spacer control gates adjacent to first and second sidewalls of the first control gate, respectively, the first and second sidewall spacer control gates being separated from the first control gate by at least the insulating liner, wherein multi-bit programmable charge storage regions are created within the charge storage layer beneath respective ones of the control gates.

2. The method of claim 1, further comprising:
   providing a protective layer overlying the charge storage layer.

3. The method of claim 2, wherein the protective layer includes a nitride layer.

4. The method of claim 1, wherein the charge storage layer includes a charge storage stack.

5. The method of claim 4, wherein the charge storage stack includes at least a bottom insulating layer, charge storage layer, and top insulating layer.

6. The method of claim 5, further wherein the charge storage layer includes at least one selected from the group consisting of a $Si_3N_4$ layer, a layer consisting of oxynitride, a layer consisting of a plurality of nanocrystals, a layer consisting of a plurality of nanoclusters, and any combinations thereof.

7. The method of claim 4, wherein the charge storage stack includes at least one selected from the group consisting of an ONO stack, an oxide nanocrystal oxide stack, and an oxide nanocluster oxide stack.

8. The method of claim 1, wherein the at least two buried bit lines includes a plurality of buried bit lines.

9. The method of claim 8, wherein the plurality of buried bit lines are formed subsequent to providing of the charge storage layer.

10. The method of claim 1, wherein the first control gate includes at least one conductor selected from the group consisting of polysilicon and metal.

11. The method of claim 1, wherein the first control gate includes polysilicon.

12. The method of claim 1; wherein the insulating liner includes an oxide.

13. The method of claim 1, wherein forming the first control gate includes forming a plurality of first control gates, and
wherein forming the insulating liner includes forming the insulating liner overlying the plurality of first control gates.

14. The method of claim 1, further wherein the multi-bit programmable charge storage regions are positioned a) underlying the first control gate within the charge storage layer and in a region proximate a boundary of a buried bit line and an active region, and b) underlying the first and second sidewall spacer control gates within the charge storage layer and in a region proximate a boundary of a buried bit line and an active region.

15. The method of claim 1, wherein forming the first control gate includes forming a plurality of first control gates, and wherein forming the first and second sidewall spacer control gates includes forming a plurality of first and second sidewall spacer control gates adjacent to sidewalls of individual ones of the plurality of first control gates, wherein individual ones of the first and second sidewall spacer control gates are separated from a respective first control gate by at least the insulating liner.

16. The method of claim 1 wherein forming the first control gate includes forming a plurality of first control gates, and wherein forming the first and second sidewall spacer control gates includes forming the first sidewall spacer control gate on a first sidewall of a desired one of the first control gates, wherein the first sidewall spacer control gate extends between the desired one of the first control gates and an adjacent one of the first control gates, and forming the second sidewall spacer control gate on a second sidewall of the desired one of the first control gates, wherein the second sidewall spacer control gate further extends between the desired one of the first control gates and an opposite adjacent one of the first control gates.

17. The method of claim 1, wherein forming the first and second sidewall spacer control gates includes depositing a conformal layer of conductive material overlying the first control gate followed by anisotropic etching of the conformal layer.

18. The method of claim 17, wherein the conductive material includes polysilicon.

19. The method of claim 1, further comprising forming a silicide on the first and second sidewall spacer control gates.

20. The method of claim 1, further comprising forming a silicide on the first control gate and on the first and second sidewall spacer control gates.

21. The method of claim 1, wherein the charge storage regions are programmable via a process of hot carrier injection.

* * * * *